(12) United States Patent
Abbott et al.

(10) Patent No.: US 6,800,370 B2
(45) Date of Patent: Oct. 5, 2004

(54) PHOTORESPONSIVE SURFACES (75) Inventors: Scott J. Abbott, Greenwith (AU); John Ralston, Mitcham (AU); Geoffrey D. Reynolds, Fulham (AU); Robert A. Hayes, ET Valkenswaard (NL)

(73) Assignee: University of South Australia, Adelaide (AU)

( * ) Notice: Subject to any disclaimer, the term of this patent is extended or adjusted under 35 U.S.C. 154(b) by 117 days.

(21) Appl. No.: 09/978,835

(22) Filed: Oct. 16, 2001

(65) Prior Publication Data

US 2002/0084179 A1 Jul. 4, 2002

Related U.S. Application Data (60) Provisional application No. 60/240,688, filed on Oct. 16, 2000.

(51) Int. Cl.[7] .......................... B32B 15/00; B32B 27/00
(52) U.S. Cl. ...................... 428/409; 428/420; 428/426; 428/446; 428/457; 204/157.15
(58) Field of Search ................................ 428/420, 426, 428/446, 457, 409; 204/157.15

(56) References Cited

U.S. PATENT DOCUMENTS 5,948,316 A * 9/1999 Shashidhar et al. ...... 252/299.4
6,001,277 A * 12/1999 Ichimura et al. ......... 252/299.4

OTHER PUBLICATIONS

Calvert, "Lithographically Patterned Self–Assembled Films," Abraham Ulman (ed.), *Thin Films, Organic Thin Films and Surfaces: Direction for the Nineties*, Academic Press, 1995, pp. 109–141.

Steinberg et al., "Ion–Selective Monolayer Membranes Based on Self–Assembling Tetradentate Ligand Monolayers on Gold Electrodes: Nature of the Ionic Selectivity," in Abraham Ulman (ed.), *Thin Films, Organic Thin Films and Surfaces: Direction for the Nineties*, Academic Press, 1995, pp. 183–205.

Tohnai et al., "Photodimerization of Thymine Derivatives in Single Crystal," *J. Photopolymer Science and Technology* 11(1):59–64, 1998.

* cited by examiner

*Primary Examiner*—Monique R. Jackson
(74) *Attorney, Agent, or Firm*—Seed IP Law Group PLLC

(57) ABSTRACT

The invention relates to an article having a photoresponsive surface, said article comprising a substrate having photo-ionisable moieties capable of undergoing dimerization attached to at least a portion of a surface thereof, the proximity of said moieties to one another being such that irradiation with light of an appropriate wavelength results in dimerization of at least a portion of said moieties thereby altering the wettability of the surface. Methods of preparing a substrate having a photoresistive surface and methods for altering the wettability of a surface of a substrate are also included.

33 Claims, 7 Drawing Sheets

N[1]-alkylthymine MONOMER
(pKa ~ 10.3)

N[1]-alkylthymine DIMER
(pKa > 13)

Figure 4: Sessile drop profiles for $C_5$ terminated gold SAM over one full irradiation cycle. Time of irradiation, 24 minutes. (a) No irradiation, (b) Irradiation at 280nm, (c) Irradiation at 240nm. Right droplet is at pH 5.8, left droplet is at pH 11.1.

PHOTORESPONSIVE SURFACES

The present invention relates to surfaces which can alter their wetting properties when subjected to an external stimulus. More particularly, the present invention relates to photoresponsive surfaces, and methods for altering their wettability, articles comprising such surfaces and methods for preparing said surfaces.

Wetting plays a decisive role in the success or failure of many industrial and natural Photographic film production, pigment dispersion, mineral flotation, the movement of water in soils, printing, optical filters and aspects of gene therapy are all controlled in large measure by wetting and dewetting processes. The liquid phase involved is most commonly, but not exclusively, water.

The wetting of a surface is characterized by the Young equation $$\gamma_{SV} = \gamma_{SL} + \gamma_{LV} \cos \theta \quad (I)$$

which describes the balance between the interfacial tensions ($\gamma$) which exist at the three-phase line of contact between solid (S), liquid (L) and vapour (V). A change in the wetting of a surface by a liquid is reflected by the contact angle ($\theta$) which is measured through the denser phase as the angle that the tangent to the liquid-vapour interface makes with the solid surface at the contact line.

The change in wettability and in the contact angle is predicted by $$\cos\theta(pH) = \cos\theta(pH_{pzc}) - \frac{\Delta F_{dl}(pH)}{\gamma_{lv}} \quad 1$$

where $\theta$ is the contact angle at the solid-liquid-vapour interface.

$\gamma_{lv}$ is the liquid-vapour surface tension, $pH_{pzc}$ is the pH where the surface bears zero charge and $\Delta F_{dl}$ is the free energy of double layer formation. Correspondingly, the free energy of formation of a single double layer is given by $$\Delta F_{dl} = -\int_0^{\psi_0} \sigma_0 \, d\psi \quad 2$$

where $\Psi_0$ is the electrical potential of the solid-liquid interface and $\sigma$ is the surface charge. This equation is valid for Nernstian surfaces i.e. for those for which $\Psi_0(pX)$ (where X is the potential determining ion) obeys the Nernst equation. For non-Nerstian surfaces, configurational contributions can be included in equation 2. The $\Delta F_{dl}$ contribution in Equation 2 can be readily calculated from electrical double layer theory. For Nernstian surfaces this is achieved by calculating $\theta_0(\Psi_0)$ from the Polsson-Boltzmann equation and performing the integration in Equation 2, In this case, for a flat diffuse double layer, $$\Delta F_{dl} = -\frac{8n_0 kT}{\kappa} \left\{ \cosh \frac{ze\psi_0}{2kT} \right\} \quad 3$$

where $n_0$ is the concentration of the symmetric z:z electrolyte, k is the Boltzmann constant, $\kappa$ the reciprocal double layer thickness and e the elementary charge. The relationship between surface charge, pH and the influence of ionic strength is thus complete. By way of illustration only, when a molecular surface ionizes as the pH increases above its pKa, say, by one pH unit, where $H^+_{sq}$ is the potential determining ion, the increased surface charge causes the contact angle to decrease and the surface becomes more wettable with respect to the wetting phase. Thus, by changing the surface charge or pKa of a surface, its wetting properties can conceivably be altered.

It has now been found that certain molecules attached as a thin layer or film to the surface of a substrate, impart a photoresponsitivity to the substrate surface such that the wettability of the surface changes when it is irradiated with light of an appropriate wavelength.

Accordingly, in a first aspect, the present invention provides an article having a photoresponsive surface, said article comprising a substrate having photoionisable moieties capable of undergoing dimerization attached to at least a portion of a surface thereof, the proximity of said moieties to one another being such that irradiation with light of an appropriate wavelength results in dimerization of at least a portion of said moieties thereby altering the wettability of the surface.

In another aspect, the present invention also provides a method for preparing a substrate having a photoresponsive surface which method comprises attaching to at least a portion of the substrate surface, photoionisable moieties capable of undergoing dimerization wherein the proximity of said moieties to one another on the substrate surface is such that irradiation of said moieties with light of an appropriate wavelength results in dimerization of at least a portion of said moieties, thereby altering the wettability of the surface.

In yet a further aspect, the invention provides a method for altering the wettability of a surface of a substrate, said substrate having attached to at least a portion of said surface photoionisable moieties capable of undergoing dimerization, wherein the proximity of said moieties to one another on said surface is such that dimerization can occur, said method comprising irradiating said surface with light at an appropriate wavelength sufficient to dimerize at least a portion of the photoionisable moieties.

The present invention is based on the finding that certain molecules, when irradiated by light of an appropriate wavelength, can covalently couple to give a dimeric form which has a different pKa value to that of the individual molecule. When such molecules (i.e. the monomer) are attached to a substrate surface, in a way that they can dimerize, this can provide a photoresponsive surface whose wettability may be altered by irradiation at the appropriate wavelength.

The ionisable moiety may be any moiety which is ionisable upon irradiation with light of a suitable wavelength and which is capable of undergoing dimerization upon ionisation. In a preferred form, the ionisable moieties contemplated by the present invention are nitrogenous heterocyclic moieties, eg. a 5–7-membered ring having 1 or 2 nitrogen atoms and preferably at least one double bond available for dimerization.

Of the nitrogenous heterocyclic moieties, a particularly preferred class of photoionisable moieties are pyrimidine-related and incorporate the substructure (I):

(I)

wherein ⸺ is an optional double bond and, where valency dictates, the trivalency of the nitrogen atom is completed by H, methyl, ethyl or propyl. In a preferred form, there is at least one double bond, more preferably a, is a double bond. In a particularly preferred form a is a double bond and b and c are single bonds.

Optionally, one or more carbon atoms may be further substituted by a substituent selected from methyl, ethyl, propyl (n- or iso-), oxo, halo (fluoro, chloro, bromo, iodo), halomethyl, hydroxy, methoxy, ethoxy, propoxy, $C_{1-3}$acyloxy; amino, carboxy, carboxyethyl and carboxymethyl.

Another class of nitrogenous heterocyclic moieties contemplated are the spiropyrans, for example spiroindoline.

With respect to the pyrimidine-related moieties, the "dimerization" will generally be a [2+2] cyclisation to form a cyclobutane ring. Thus, the position of the substituents and double bonds within (I) must be such that ionisation and subsequent dimerization of at least a portion of the moieties can occur upon irradiation of light with an appropriate wavelength. The placement of the substituents on (I) will affect the steric bulk of the moiety, thereby influencing the final proximity of these moieties to one another on attachment to the substrate surface and, therefore, the efficiency of the dimerization.

The person skilled in the art will also recognise that judicious selection of the substituents of (I) will influence the hydrophobicity/hydrophilicity of the photoresponsive surface.

Examples of suitably substituted pyrimidine-related moieties include thymine, uracil, cytosine, orotic acid and barbituric acid. Another class of moieties which contain the substructure (I) are the purine bases such as adenine and guanine.

The skilled person will recognise that dimerization may occur between two identical moieties or two different moieties The steric constraints imparted by the substituents will determine whether the dimerization can be reversed. For example, where the resultant dimeric moiety is under steric strain, irradiation at a different wavelength to that which effected dimerization may cleave (i.e. reverse) the dimerization product. Thus, for example, where the moiety is thymine, where the reactive double bond is substituted by a methyl group, the resulting cyclobutane-containing dimer is more sterically strained and reversibility of the dimerization can be effected under appropriate conditions. Conversely, for example, where the moiety is uracil, the dimerization is observed as being irreversible under the same conditions which reverse the thymine dimerization. Thus by selection of appropriate substituents of (I), the dimerization, and hence the change in wettability of the surface, can be made partially or substantially fully reversible or irreversible.

The attachment of the photoionisable moieties to the substrate surface may be effected ay direct attachment to the substrate surface, or, preferably, attached via a linking group which is covalently grafted to the ionisable moiety. Where the moiety is pyrimidine-related, preferably attachment of the linking group occurs via a nitrogen atom of the photoionisable moiety.

An example of a suitable linking group for linking the photoionisable moiety to the substrate surface include alkyl chains having from 1 to about 30 carbon atoms, preferably at least 5 carbon atoms. Optionally, one or more of the carbon atoms of the linking chain (eg methylene groups) can be replaced by S, O or NH. In yet another embodiment, amide groups can be introduced into alkyl chain for additional stability (S. W. Tam-Chang, H. A. Bicbuyck, G. M. Whitesides, N. Jeon and R. G. Nuzzo, *Langmuir,* 11, 4371, 1995 AND J. Huang and J. C. Heminger, *J. Am. Chem, Soc.,* 115, 3342, 1993).

Attachment of the molecules containing the photoionisable moieties to the substrate surface can occur in a number of ways, for example chemi- or electrosorption, or alternatively, by direct physical deposition onto the surface.

Where the molecule containing the ionisable moiety is chemisorbed to the substrate surface, this can occur via a moiety which is reactive with the surface of the substrate, such as a thiol group or hydroxy group. In a preferred embodiment, the reactive moiety is a thiol group. In a particular example, a thiol group can be used to chemically attach the ionisable moiety, optionally via a linking group, to a gold substrate surface. In another example, chemisorption to the surface of the fluorite or aluminum oxide surface can be achieved by a carboxylic acid group (with the pH above the pKa of the carboxylic acid group).

In another embodiment, the ionisable moiety is attached to the substrate surface via an electrosorptive process. Thus, where the substrate surface is charged, a group of the opposite charge offers the opportunity of electrostatically anchoring the moieties on the substrate For example, where the surface of the substrate is negatively charged, such as mica, electrostatic attraction between the amino group (as $NH_3^+$ at the correct pH) and the surface results in attachment. Preferably, the reactive group terminates a linking chain as described above. Electrosorptive attachment can be achieved by transfer of Langmuir-Blodgett (LB) films where a surface layer of amphiphilic molecules is compressed into a floating monolayer and transferred to a substrate by dipping.

In another embodiment, the alkyl chain lining groups terminate in a non-reactive methyl group and the molecules are deposited directly onto the substrate surface, for example by the spin cast method or by spraydrying techniques.

In order to optimize photodimerization of the moieties, a high packing density of the moieties is preferred. In addition, it is also preferable that the moieties are correctly oriented on the substrate surface. Preferably, the ionizable moieties are situated less than about 4 Å apart) preferably about 3–4 Å apart so that dimerization can occur, (Tohnai, N., Inaki, Y., Miyata, M., Yasui, N., Michizuki, E., Kai, Y., *J. Photopolymer Science and Technology,* 1998, 18, 59).

Self-assembled monolayers (SAMs) are one suitable means to achieve the molecular ordering of the nitrogenous heterocyclic moieties (Ulman, A. (Editor), *Organic Thin Films,* Directions for the Nineties, Academic Press, 1995).

Another means of achieving the desired molecular ordering is the spin-cast method.

It is also known that heat treatment, i.e. annealing, can affect the molecular orientation.

It is also within the scope of the present invention for the ionisable moieties to be fixed in proximity by molecular design of the molecules which are attached to the substrate surface, for example, more than one nitrogenous heterocyclic group may be attached to the substrate by a single linking group e.g. a branched linking group or a linking group containing a multivalent moiety such as a benzene group. This offers an advantage of providing the groups in close proximity to enhance dimerization.

One non-limiting example where the nitrogenous groups are fixed in proximity by molecular design is illustrated by 1,2-di(methylenethymyl)benzene Suitable substrates for use in the present invention include gold, fluorite, alumina, quartz, nickel, silica (e.g. glass), mica, zircon, $TiO_2$ and polymeric substrates, such as fluoropolymers, where the photoionisable moiety may be directly incorporated into the monomer which is subsequently polymerised, or alternatively, where the polymer contains a reactive group for attachment of the molecule containing the photoionisable moiety. The substrate itself may be in the form of rods, plates, bars, tubes, spheres, wafers or films, and may be a smooth (peak valley roughness variations of <2 nm) curved or flat surface or a physically heterogenous rough surface The skilled person will recognise which substrates will be suitable for use with particular attachment methods as referred to above.

The article having the photoresponsive surface maybe simply a film, capillary tube, cylindrical rod, small particles, hollow spheres or porous solid, (eg. membrane).

Irradiation of the photoresponsive surface is carried out at a wavelength which can be determined by the skilled person using routine methods for the particular photoionisable moiety. For the pyrimidine-related moieties, dimerization is carried out by irradiating the photoresponsive surface with light at a wavelength in the range of about 275 to about 285 nm, preferably at about 280 nm. Where steric constraints allow, reversibility of this dimerization process can be carried out at a wavelength of about 235 to about 245 nm, preferably at about 240 nm.

The present invention contemplates both photoresponsive surfaces which are chemically homogeneous and chemically heterogeneous. Chemically heterogeneous photoresponsive surfaces can be formed by attaching at least two different types of molecules to the substrate surface, either evenly, randomly or onto well defied areas of the substrate. The ionisable moieties may be varied and/or the length of the linking chain may also be varied. The photoresponsive surfaces may be attached onto the substrate surface as a monolayer or as multilayers and may be attached in defined areas of the substrate surface by masking.

An organic film surface which can switch between two states i.e., by a change in surface wettability, when subjected to an external stimulus has the potential to act as a switching device. Thus, one application of the present invention lies in the preparation and use of "switching devices". Switching devices have applications in areas such as photoresists, non-linear optics, computer data storage and molecular recognition and self-assembly.

Another application of the described invention is in the preparation of capillary pumps which find use in X-ray applications, reversible signs and lighting arrays.

Yet another application of the invention described herein is to "self-cleaning" surfaces such as glass polymeric and metallic surfaces. Such applications find use in windows, mirrors, lenses, scientific and photographic equipment and in building and automotive applications.

The invention will now be described with reference to the following non-limiting Examples and Figures.

EXAMPLES

Materials and Methods

Sulstrate Preparation

Class microscope cover slips (51 mm×22 mm) were cleaned by rinsing in Ultra High Quality (UHQ) water (surface tension of 72.8 $mNm^{-1}$ at 20° C., $\kappa$<0.5 $\mu$S) and then dried in a stream of nitrogen. A final plasma-cleaning step was performed by exposing each cover slip to an argon plasma (Harrick Scientific PDC-32G plasma cleaner, 60W) for 5 minutes. Quartz slides (45 mm×12.5 mm) were cleaned in 4 M KOH for 10 minutes at room temperature, rinsed in UHQ water, dried in nitrogen and plasma cleaned.

Gold substrates were prepared by resistive evaporation of gold (Aldrich, 99.99%), from a molybdenum holder, onto chromium precoated glass cover slips at room temperature. The cover slips were held in a sample holder to which metallic strips were attached. The sample was then uniformly rotated during the coating process with the aid of an external magnet, permitting both sides of the cover slip to be coated. The chromium (Aldrich, 99.996%) adhesion layer was evaporated, prior to deposition of the gold layer, from a tungsten holder.

The deposition rate and sample thicknesses were monitored with a quartz crystal oscillator. Film thickness ranged from 2.5 to 67 nm for the chromium and gold layers respectively. The deposition rates were typically 0.3 nm $s^{-1}$. The evaporation chamber was kept at $1\times10^{-6}$ torr during evaporation, with the aid of a diffusion pump whilst the substrate temperature was at or slightly above room temperature.

The roughness of the gold slides was determined using AFM imaging, with a Nanoscope III (Digital Instruments) scanning probe microscope. Three completely different layers, each of 1 $\mu$m, were scanned. The root-mean square (rms) roughness over this area was 0.680±0.036 nm. This did not detectably change after the formation of the self-assembled monolayer, nor after irradiation. For comparison, gold deposited onto a mica surface using the hot stage method was also examined. In this case the rms value was 1.000±0.542 nm over the same scan area, reducing to 0.294±0.161 nm if major defects were excluded. The gold cover slip slides were of satisfactory degree of smoothness for this investigation.

Thiol Synthesis

Figure 1:
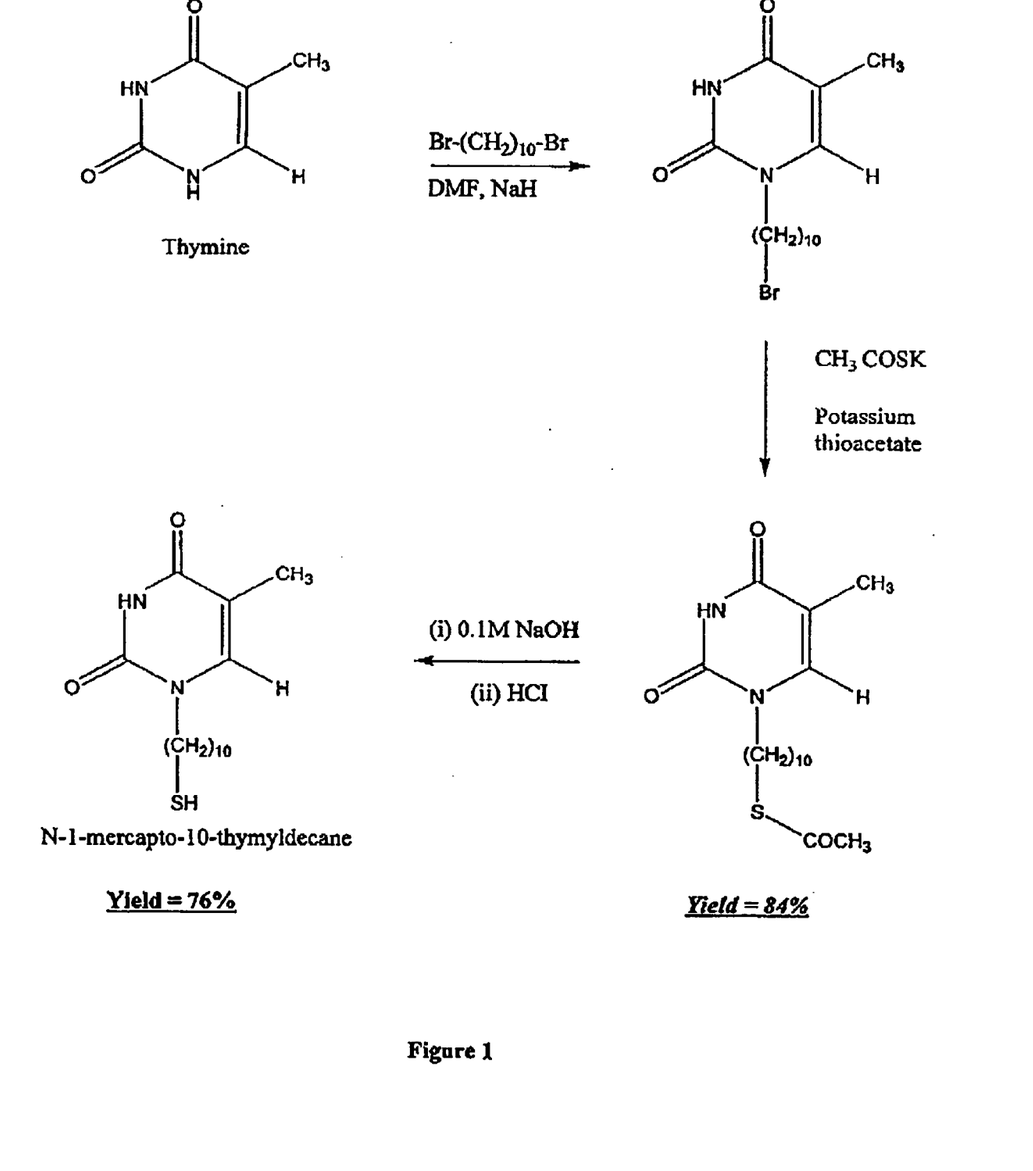
FIG. 1 schematically depicts the synthesis of N-1-mercapto-10-thymyldecane.
Figure 2:
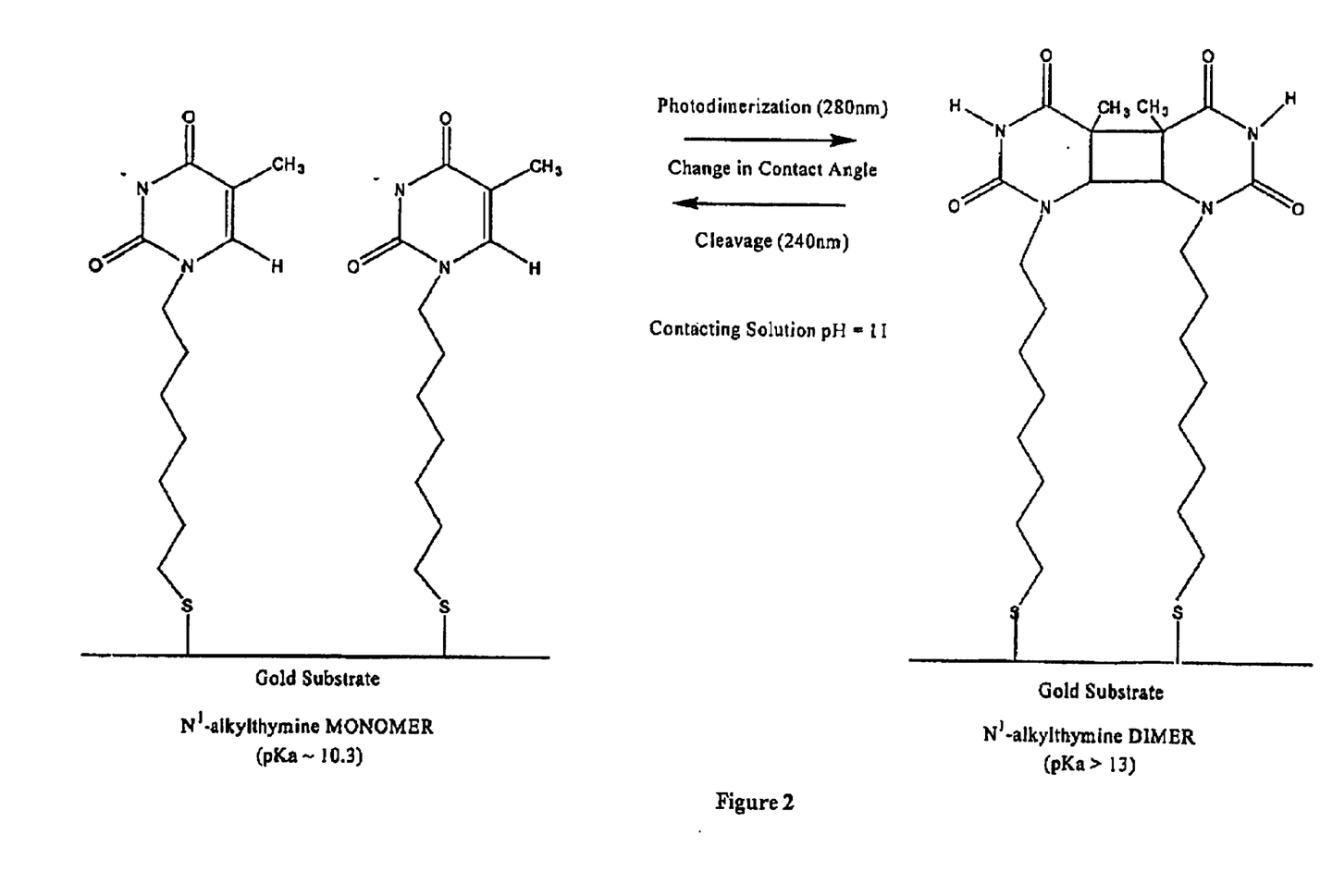
FIG. 2 schematically illustrates reversible photodimerization of thymine moieties.

N-1-Mercapto-10-thymyldecane (C1) was synthesized according to the scheme shown in FIG. 1 (Takemoto, K. and Inaki, Y., *Chapter 4 in Functional Monomers and Polymers*, Marcel Dekker, New York, 1987 and Troughton, E. B., Bain, C. D., Whitesides, G. M. Nuzzo, R. G., Allara, D. L. and Porter, M. D., *Langmuir*, 1998, 4, 365).

N-1-Mercapto-10-uracyldecane (C2) was also synthesised by a similar route. The structures were verified by FTNMR spectroscopy. $N^1$-Octylthymine (C3), $N^1$-Tridecylthymine (C4) and N-2-mercaptoethyl-2-thymylpropionamide(C5) were obtained from Dr Y. Inaki from the Department of Materials and Life Science, Graduate of School of Engineering at the University of Osaka. They were used as received for the preparation of spin-coated surfaces.

Determination of Acidity Constant (pKa)

Pyrimidine molecules exhibit different pKa values, depending on their exact molecular structure (Shugar, D. and Fox, J. J., *Biochemica et Biophysica Acta*, 1952, 9, 199). Thymine is reported to have a pKa of 9.9. This was verified by acid-base titration, monitoring the changes in the UV absorbance spectra as ionisation occurred upon addition of base. Upon alkylation, the pKa of thymine increased to 10.3 (Shackleford, D., *B. App. Sci (Hons.) Thesis*, University of South Australia, 1996). In dimerized form it increased to over 13 (Shackleford, D., *B.App.Sci (Hons.) Thesis*, University of South Australia, 1996).

Formation of Self-assembled Monolayers

Self-assembled thiol monolayers were formed spontaneously by immersing the gold substrates into a freshly prepared $1\times10^{-3}$ M solution of the thiol in distilled ethanol. The substrate was removed after 24 hours, washed with distilled ethanol and UHQ water and dried in a stream of nitrogen gas. Contact angle measurements and irradiation were then performed.

Formation of Spin-cast Films

Alkylthymine spin-cast films were formed on quartz slides. The alkylthymine was dissolved in chloroform (2.5%, w/v) and rapidly spread over the slide (mounted on a turntable) to provide as uniform a coverage as possible. The slide was rotated at 2000 RPM for 60 seconds, ensuring chloroform evaporation and that a transparent and uniform film was obtained. The casting process is critical, for if it is improperly performed, opaque films exhibiting poor dimerization yields are obtained. The films were annealed by placing the spin-coated slide on a flat hot-plate, held at a temperature just below the melting point of the alkythymine (100 to 100° C.), for specific periods of time. They were then allowed to cool to room temperature.

Preparation of Gold Colloids

In order to facilitate the characterization of pyrimidine self-assembled monolayers on gold surfaces, particularly through ATR-FTIR spectroscopy, gold colloids were prepared, according to the method of Frens (Frens, G., *Nature Physical Science*, 1973, 241 20). The particles were reasonably monodisperse, falling withing a particle size range between 94 to 158 nm in diameter.

Irradiation

Irradiation of the self-assembled monolayers and spin-cast surfaces was performed using a Nihon-Bunko Model CRM-FA Spectroirradiator equipped with a 2 kW Xe arc lamp providing monochromatic light of high flux (13.6 mJ $cm^{-2}$ $s^{-1}$). Photodimerization was performed at a wavelength of 280 nm whilst photocleavage occurred at 240 nm. Irradiation was performed at ambient temperature; no sample heating was observed even upon extended irradiation times. A full irradiation cycle corresponded to irradiation at 280 nm for the required time, then irradiation at 240 nm. Irradiation was generally performed for ten to twenty minutes for a complete cycle, depending on the nature of the surface.

Contact Angle Determinations

Contact angles were determined using the sessile drop technique (Hunter, R. J., *Foundations of Colloid Science*, Volume 1, OUP, 1981.) The treated plates were placed in a flat-walled glass container in a clean room at a constant temperature of 25°. Drops of volume 20 $\mu$l were formed with the use of a micropipette and placed directly onto the sample. The drops were observed with a camera using 5× magnification; the latter was enhanced to 13× with the use of a focussing lens. Both the camera and the sample were mounted on to stages designed to minimize vibration. The focal length was 1.1 m. The signal from the camera was fed to a monitor from which very good images were taken using a Fuji Film Digital Camera Fine Pix (1.5 mega pixels). Calibration was performed via droplet aspect ratio. The droplet volume was decreased to about 90% of its original volume in order to obtain receding contact angles. All measurements were taken in at least replicate for each sample, on different areas of the sample, as well as for different samples. Some measurements were also performed using the dynamic Wilhemy plate technique (Hayes, R. A. and Ralston, J., *J Colloid Interface Science*, 159, 429, 1993).

Attenuated Total Reflectance-Fourier Transform Infrared Spectroscopy

A single beam Nicolet Magna-IR system 750, equipped with a liquid nitrogen cooled mercury-cadmium-telluride detector was used. ATR (attenuated total reflectance) spectra were recorded with a SPECTRA-TECH Inc. ATR trough cell Model 005-390T, with a trapezoidal ZnSe crystal and a 45° angle of incidence, as the internal reflection element.

The ZnSe crystal was coated with a thin layer of the gold particles and then dried under vacuum at room temperature, leaving a uniform layer of particles on the ZnSe surface. Compound 5 was dissolved in tetrachloromethane, $CCl_4$, to form a $1\times10^{-4}$ M solution and allowed to contact the ZnSe crystal in the ATR cell for one hour, permit chemisorption to occur. The cell was then flushed with fresh $CCl_4$ to remove any unreacted compound. The cell was then dried in a stream of dry nitrogen.

Fifty scans were co-added to obtain each spectrum, with a resolution of 4 wave numbers. All spectra were recorded using a blank ATR cell as the background.

X-Ray Photoelectron Spectroscopy

XPS measurements were performed on modified gold surfaces using a Perkin-Elmer Physical Electronics (PHI) 5100 ESCA System. Details of the calibration are given elsewhere (Fomnasiono, D., Li, F., Ralston, J., and Smart, R. St. C., *J. Colloid, Interface Science*, 164, 333, 1994). X-rays from the MgK$\alpha$1 source were operated at a fixed pass energy of 93.9 eV. Low power settings (200 W, 12.5 KV) together with a take-off angle of 45° with respect to the sample surface were used. Samples were cut into 1 $cm^2$ squares with a diamond etcher and mounted on stainless steel stubs for use in the spectrometer. All signals were referenced to the C1s peak at 284.7 eV.

X-ray Diffraction and Optical Microscopy

Powder XRD measurements were made on spin-coated quartz substrates. XRD Spectra for compounds 3 and 4 were collected using a Rigaku RAXIS-CS imaging plate two-dimensional detector using graphite, monochromatized CuK$\alpha$1 radiation ($\lambda$=1.54056 A at 15° C.). Optical examination of specimens was performed using an Olympus microscope with polarized light capability.

EXAMPLE 1

Compound 5 (C5) was used to form a self-assembled monolayer on the gold coated cover slips. The surface was characterized using XPS, ATR-FTIR and contact angle measurements. UV absorbance spectroscopy and XRD studies were not feasible due to the opaque character of the gold surface and the insensitivity of XRD at monolayer coverages.

XPS analysis of a fresh CS SAM before irradiation showed there to be a sulfur 2 p peak at a binding energy of 162.1 eV, characteristic of thiols adsorbed onto gold (i.e. R—S—Au). Extended UV irradiation of this SAM showed no evidence of photooxidation. If oxidation had occurred, with the formation of $RSO_3$; and extra peak with a higher binding energy (167 eV) was expected, but was absent. Similar results were obtained for compounds C1 and C2. Thus the thymine SAMs were stable to the intense, cold UV irradiation used.

For the ATR-FTIR measurements, gold colloids were used rather than flat surfaces in order to maximize the signal intensity by using a large surface area. ATR-FTIR spectra of compound C5 dissolved in tetrachloromethane were compared with C5 SAMs adsorbed on the colloidal gold particle in the wave number range between 1000 and 2500 $cm^{-1}$. In both cases the peaks appeared at similar wave numbers, albeit those for the SAMs were weaker in intensity and shifted slightly, due to adsorption.

The dominant absorption band in the spectrum appeared at 1550 $cm^{-1}$ and was assigned to the amide II band (N—H bending) of the trans conformer of a secondary amide. The presence of an intense amide II band and the absence of any absorption in rue 1450 $cm^{-1}$ region indicates that the amide exists solely in the trans-conformation.

Figure 3:
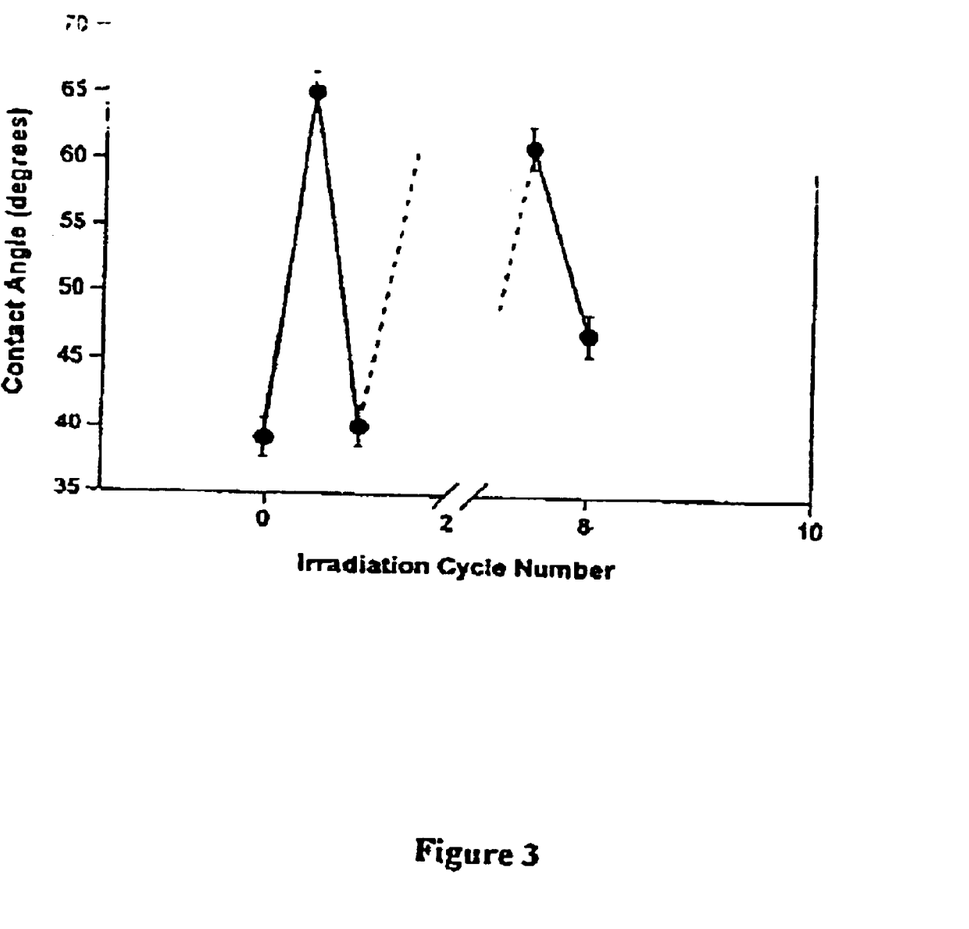
FIG. 3 graphically depicts the reversibly wettability over 8 cycles at pH 11.1 for a C5 thymine terminated gold SAM.
Figure 4:
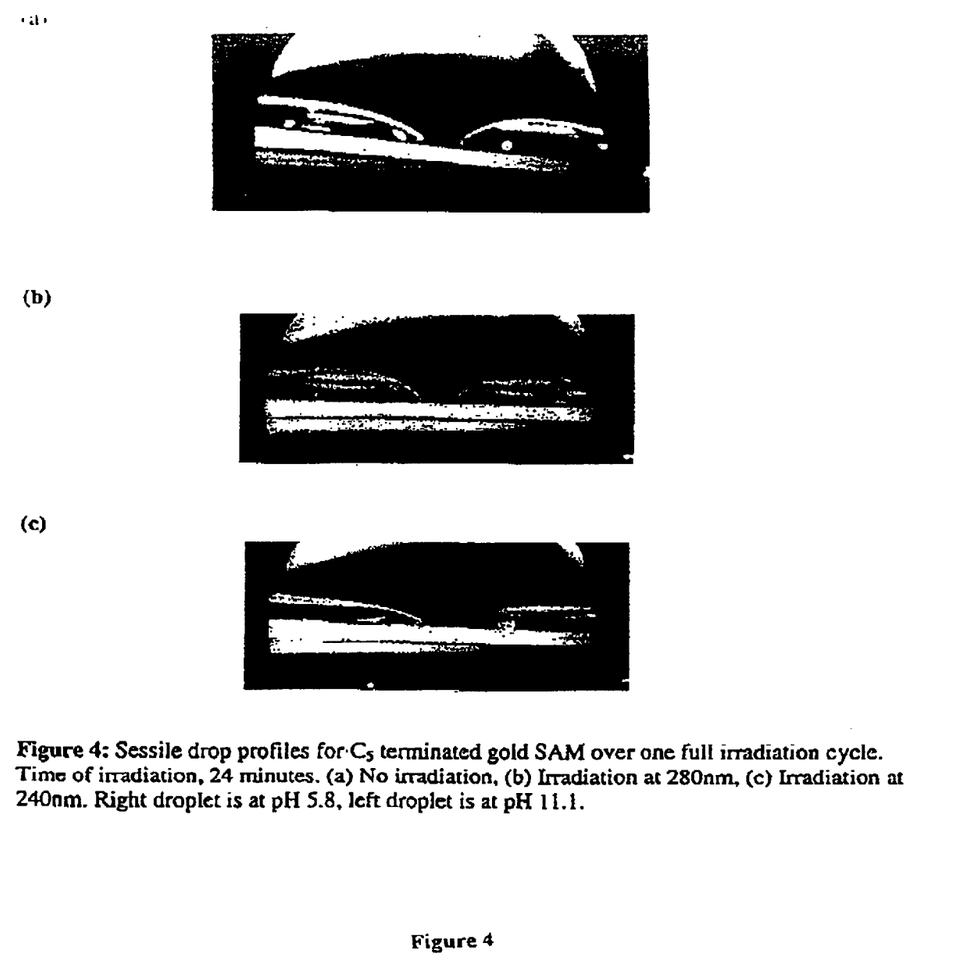
FIG. 4 photographically illustrates sessile drop profiles for C5 terminated gold SAM over one full irradiation cycle. Time of irradiation, 10 minutes, (a) no irradiation, (b) irradiation at 280 nm, (c) irradiation at 240 nm. RH drop is at pH 5.8, LH drop is at pH 11.1.

Contact angle changes at various stages of irradiation are given in Table 1 and FIG. 3, using the sessile drop technique, for the C5 SAM. Advancing water contact angles for drops at a near neutral pH of 5.8 are compared with drops at pH 11.1. Measurements were completed within several minutes without any detectable change in pH. A Comparison of the drop profiles for the surfaces over a complete cycle is shown in FIG. 4. Within experimental error, the same results were obtained for dynamic Wilhelmy plate determinations. The latter measurements take somewhat longer, however, and sample a far greater area of the SAM surface.

TABLE 1

Wetting Results for a C5 Thymine Terminated Gold SAM
(total time of irradiation, 80 minutes)

| Irradiation State | Advancing Contact Angles (degrees) | |
|---|---|---|
| | pH = 5.8 | pH = 11.1 |
| 0 cycles | 63 ± 2 | 39 ± 2 |
| 0.5 cycle | 67 ± 2 | 65 ± 2 |
| 1 cycle | 62 ± 2 | 40 ± 2 |
| 4 cycles | 59 ± 2 | 43 ± 2 |
| 7.5 cycles | 62 ± 2 | 61 ± 2 |
| 8 cycles | 61 ± 2 | 47 ± 2 |

For the first cycle a change in contact angle of 26 degrees was observed between the monomer and photodimer states. Further irradiation did not change this angle, indicating that the irradiation time had achieved a photostationary state. This contact angle change was completely reversible for the first cycle. This reversibility persisted over 8 cycles on the C5 gold SAM with the only difference being a gradual decrease in the magnitude of the contact angle change. After 8 cycles the magnitude of this change reduced to 14 degrees. The sane pattern of behaviour and magnitude of changes was observed for the C1 SAM. It mirrors the photodimerization behaviour reported for spin-cast films, as discussed further below. For the C2 case, photodimerization was irreversible, because photocleavage is inhibited for uracil, compared with thymine; in the latter case the presence of the $CH_3$ groups on the cyclobutane ring facilitates photocleavage. The contact angle change for the C2 uracil was 16° at pH 10.7.

Hysteresis between the advancing and receding contact angles was 30±4 degrees under conditions where the surface was uncharged and 15±4 degrees when the surface was charged. There was no variation with the number of cycles. The hysteresis was evident for both the sessile drop and Wilhelmy plate techniques. There was no evidence of any contact line pinning in the latter case when the surface was scanned. This hysteresis is attributed to the small but detectable roughness of the gold surfaces and the accompanying change in the hydrophobicity following ionization.

EXAMPLE 2

Spin-cast layers of octylthymine (C3) were prepared on quartz plates. Investigations were performed before and after annealing, which influence molecular orientation.

Irradiation at both 280 and 240 nm showed that there was a marked difference between the annealed (110 degrees for 10 minutes) and non-annealed films, in terms of their photoactivity. The non-annealed film exhibited reversible photodimerization whilst the annealed layer exhibited reduced or no photoactivity, depending on annealing time. There was a gradual decrease in the magnitude of the absorbance change over the repeated irradiation cycles.

Figure 5:
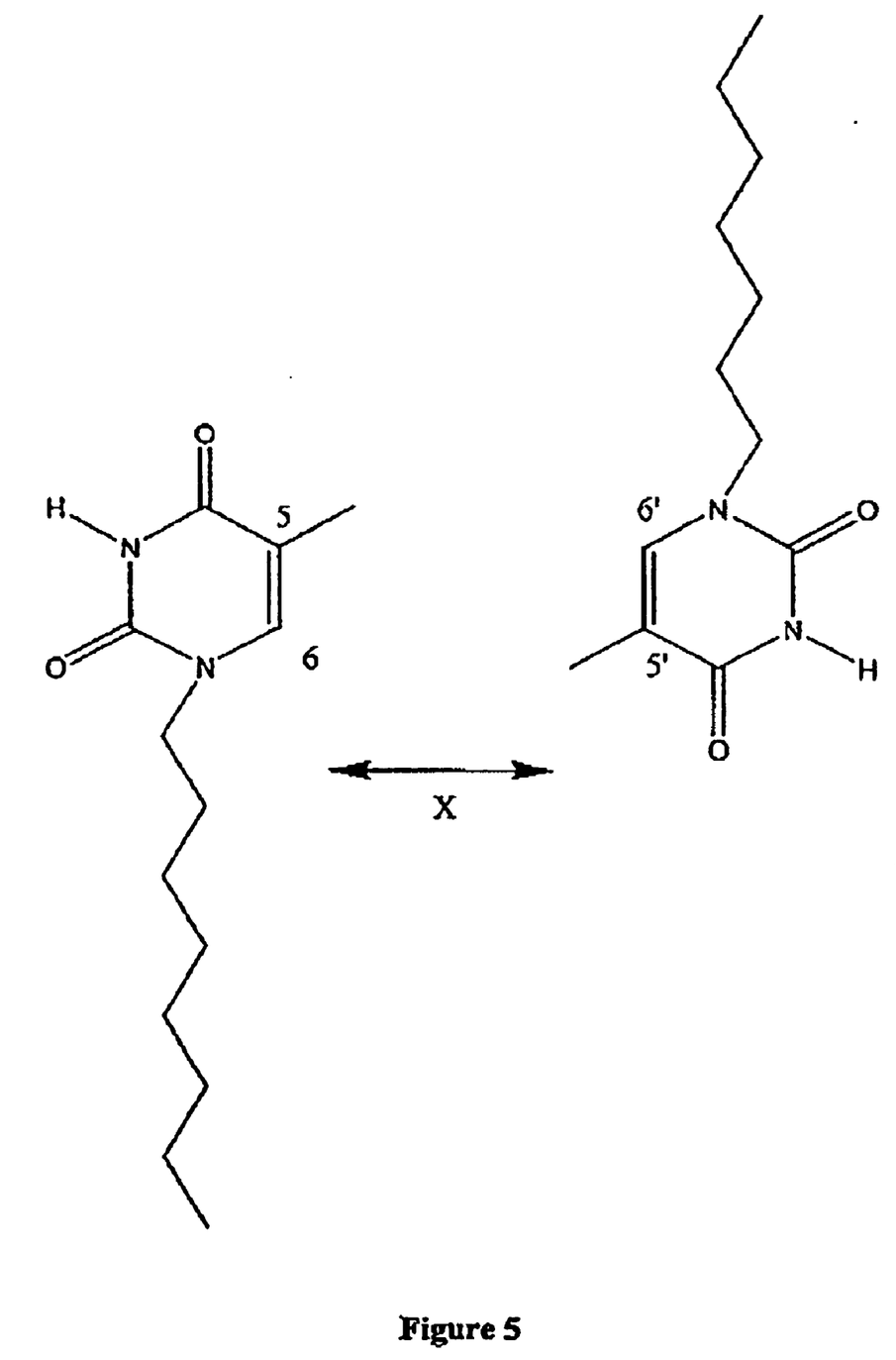
FIG. 5 schematically illustrates the dependence of thymine photodimerization on x(Å) which is dependent on annealing time.

Prior to annealing, the C5 to C6 distance in the alkythymine (FIG. 5) is small enough (3.3 Å) to permit photodimerization to occur. Upon annealing, heating causes the molecules to rearrange into their lowest energy configuration, with the result that C5 and C6 distance is now too great (4.344 Å) for dimerization to take place. Interestingly, prolonged irradiation of the annealed film caused it to regain partial photoactivity.

Figure 6:
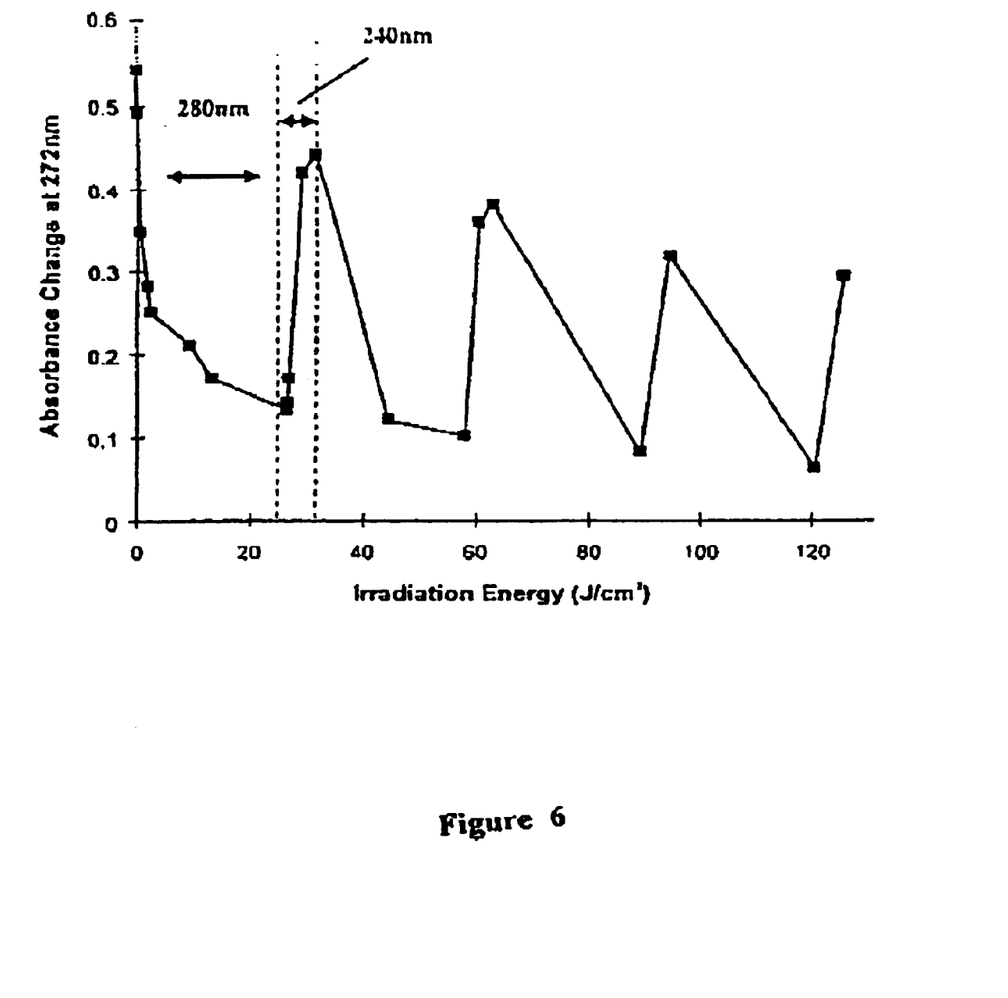
FIG. 6 graphically depicts reversible photodimerisation of non-annealed octylthymine.

Also examined was the photoactivity of the non-annealed thymine. In FIG. 6 the absorbance change of the non-annealed octylthymine film is shown as a function of the irradiation energy. There is a gradual decrease in the magnitude of the absorbance change. It is also apparent that photodimerization and photocleavage occur at different rates. In this instance, the annealed film maintained its crystallinity over at least 4 irradiation cycles, as shown by XRD studies (distinct peaks were observed whose intensity and position did not alter). For the case of the non-annealed film, any crystallinity rapidly decreased and the film became totally amorphous after 1.5 cycles of irradiation.

Optical examination of both films under polarized light showed evidence of cracking in the initially clear and uniform texture of the non-annealed films together with an increase in the opacity, after irradiation, for the annealed film there was evidence of crack formation prior to irradiation. After 4 cycles of irradiations the annealed film became opaque to light. Quite clearly the texture of these films is altered both by the annealing and irradiation.

Advancing water contact angles for the octylthymine films are shown in Table 2. At pH 11.1 the non-annealed film gave the largest contact angle change (20 degrees) between the monomer and photodimer states. The process was reversible and was maintained over 4 cycles. In the annealed case the film was unstable, even before irradiation-defects in the film permitted penetration of the aqueous phase and detachment of the film at pH 11.1. At pH 5.8, quite small contact angle changes of 5 degrees or so were observed following photodimerization. Texture changes were detected by optical microscopy, as noted above.

TABLE 2

Spin-Cast Octylthymine Film (non-annealed)
Total time of Irradiation, 214 minutes.

| Irradiation State | Advancing Contact Angles (degrees) | |
|---|---|---|
| | pH = 5.8 | pH = 11.1 |
| 0 cycles (monomer) | 62 ± 2 | 46 ± 2 |
| 0.5 cycle (dimer) | 67 ± 2 | 66 ± 2 |
| 1 cycle (monomer) | 67 ± 2 | 47 ± 2 |
| 4 cycles (monomer) | 61 ± 2 | 43 ± 2 |

Molecular rearrangement and textural changes, accompanied by an increase in opacity, evidently contribute to the gradual degradation of these octylthymine films.

EXAMPLE 3

Spin-cast layers of tridecylthymine (C4) were prepared on quartz plates.

Figure 7:
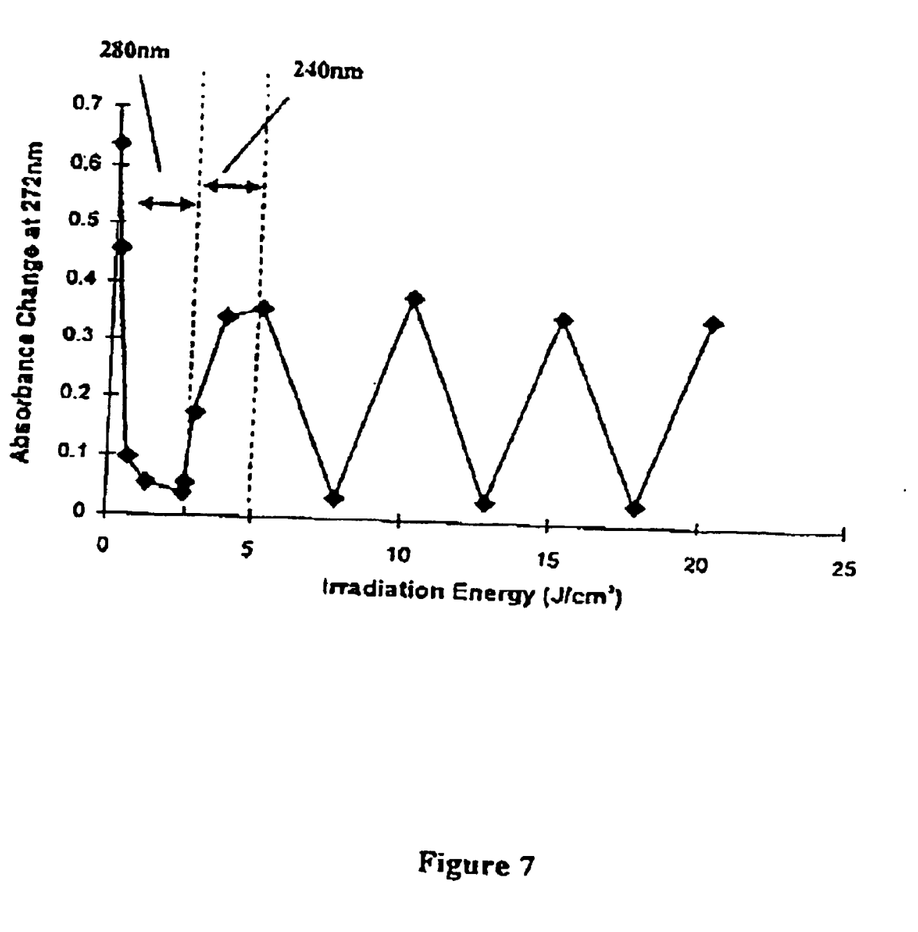
FIG. 7 graphically depicts reversibly photodimerisation of annealed tridecylthymine.

UV absorbance spectra showed that both the annealed (110 degrees for 2 minutes) and non-annealed films undergo reversible photodimerization and that the rate is fast, particularly in the annealed case (FIG. 7), with the photostationary state reached after just 6 minutes of irradiation at 280 nm. The percentage of conversion of the monomer to photodimer was greater in the annealed case (94% compared with 68% in the non-annealed film). In FIG. 7 it is also clear that the photoreversibility persists over 4 cycles and shows no sign of any decrease in the magnitude of the maximum absorbence change; neither is there any shift in the baseline. Reversible dimerization is also evident for the non-annealed film but the magnitude decreases upon repeated irradiation. For the very long chain tridecylthymine layers, short annealing times improve the photoactivity of the film compared with the non-photoactivity decreased. The non-annealed film was amorphous, as observed by XRD examination; it remained so over repeated irradiation cycles. The annealed (2 minutes) film displayed quite strong crystallinity. Upon irradiation at 280 nm some crystallinity disappeared, but was partially regained at 240 nm. The pattern of loss and recovery then remained constant over repeated irradiation cycles. Under the optical microscope the non-annealed film was uniform and clear, turning opaque after irradiation at 280 nm.

There was some regeneration when irradiation at 240 nm occurred however the surface gradually became patchy, with faint evidence of film cracking, after 4 cycles. The annealed film was quite dark and opaque in comparison with the non-annealed film. There was little change in its appearance over 4 irradiation cycles.

Advancing water contact angles for the annealed tridecylthymine films are shown in Table 3. Contact angle changes between the monomer and photodimer state at pH 11.1 are 20 degrees after one cycle, decreasing to 11 degrees after 4 cycles. The changes for the non-annealed film are generally less than ten degrees and also decrease with the number of irradiation cycles. Hysteresis was not investigated for the tridecyolthymine layers.

The non-annealed and two minute annealed films of octyl and tridecyl thymine are indeed a mixture of these two states, as shown by XRD. The largest photoinduced contact angle changes were observed for these spin-cast films.

Of the four spin-cast films, described in Examples 2 and 3, the two minute annealed tridecylthymine film exhibited the best overall performance. It exhibited the fastest rate of photodimerisation, the highest percentage conversion of monomer to dimer, the film was stable and relatively defect-free and there was a satisfactory reversible change in contact angle upon irradiation.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

Those skilled in the art will appreciate that the invention described herein is susceptible to variations and modifications other than those specifically described. It is to be understood that the invention includes all such variations and modifications which fall within the spirit and scope. The invention also includes all of the steps, features, compositions and compounds referred to or indicated in this specification, individually or collectively, and any and all combinations of any two or more of said steps or features.

We claim:

1. An article having a photoresponsive surface, said article comprising a substrate having photoresponsive moieties capable of undergoing reversible dimerization attached to at least a portion of a surface thereof, the proximity of said moieties to one another being such that irradiation with light of an appropriate wavelength results in reversible dimerization of at least a portion of said moieties thereby altering the wettability of the surface.

2. An article according to claim 1 wherein the photoresponsive moieties are nitrogenous heterocyclic moieties.

3. An article according to claim 2 wherein the nitrogenous heterocyclic moieties incorporate formula (I):

(I)

wherein at least one of ═══is a double bond, and where valency dictates, the trivalency of the nitrogen atom is completed by H, Me, Et or Pr.

4. An article according to claim 3 wherein one or more of the carbon atoms of (I) is substituted by a substituent selected from the group consisting of methyl, ethyl, propyl, oxo, halo, halomethyl, hydroxy, methoxy, ethoxy, propoxy, $C_{1-3}$acyloxy; amino, carboxy, carboxyethyl and carboxymethyl.

5. An article according to claim 3 wherein the nitrogenous heterocyclic moieties are selected from the group consisting of thymine, uracil, cytosine, orotic acid and barbituric acid.

6. An article according to claim 1 wherein the photoresponsive moieties are attached to the substrate via a linking group.

7. An article according to claim 6 wherein the linking group is an alkyl chain of from 1 to about 30 carbon atoms, wherein one or more of the carbon atoms can be replaced by, —S—, —O—, —NH— or —(O)—NH—.

8. An article according to claim 7 wherein the linking group is terminated by a reactive group for attachment to the substrate.

9. An article according to claim 7 wherein the linking group is terminated by a non-reactive group for attachment to the substrate.

10. An article according to claim 1 wherein the substrate is selected from the group consisting of gold, fluorite, alumina, quartz, nickel, silica, mica, zircon, TiO$_2$ and polymeric substrates.

11. An article according to claim 1 wherein the photoresponsive moieties are less than 4 Å apart.

12. A method for preparing a substrate having a photoresponsive surface which method comprises attaching to at least a portion of the substrate surface, photoresponsive moieties capable of undergoing reversible dimerization wherein the proximity of said moieties to one another on the substrate surface is such that irradiation of said moieties with light of an appropriate wavelength results in reversible dimerization of at least a portion of said moieties, thereby altering the wettability of the surface.

13. A method according to claim 12 wherein the photoresponsive moieties are attached to the substrate surface by chemical, electrostatic or direct physical deposition.

14. A method according to claim 12 wherein the photoresponsive moieties incorporate formula (I):

(I)

wherein at least one of ═══ is a double bond, and where valency dictates the trivalency of the nitrogen atom is completed by H, Me, Et or Pr.

15. A method according to claim 14 wherein one or more of the carbon atoms of (I) is substituted by a substituent selected from the group consisting of methyl, ethyl, propyl, oxo, halo, halomethyl, hydroxy, methoxy, ethoxy, propoxy, C$_{1-3}$acyloxy, amino, carboxy, carboxyethyl and carboxymethyl.

16. A method according to claim 14 wherein the nitrogenous heterocyclic moieties are selected from the group consisting of thymine, uracil, cytosine, orotic acid and barbituric acid.

17. A method according to claim 12 wherein the photoresponsive moieties are attached to the substrate via a linking group.

18. A method according to claim 17 wherein the linking group is an alkyl chain of from 1 to about 30 carbon atoms, wherein one or more of the carbon atoms can be replaced by, —S—, —O—, —NH— or —C(O)—NH—.

19. A method according to claim 17 wherein the linking group is terminated by a reactive group for attachment to the substrate.

20. A method according to claim 17 wherein the linking group is terminated by a non-reactive group for attachment to the substrate.

21. A method according to claim 12 wherein the substrate is selected from the group consisting of gold, fluorite, alumina, quartz, nickel, silica, mica, zircon, TiO$_2$ and polymeric substrates.

22. A method according to claim 12 wherein the photoresponsive moieties are less than 4 Å apart.

23. A method for altering the wettability of a surface of a substrate, said substrate having attached to at least a portion of said surface photoresponsive moieties capable of undergoing reversible dimerization, wherein the proximity of said moieties to one another on said surface is such that reversible dimerization can occur, said method comprising irradiating said surface with light at an appropriate wavelength sufficient to dimerize at least a portion of the photoresponsive moieties.

24. A method according to claim 23 wherein the photoresponsive moieties incorporate formula (I):

(I)

wherein at least one of ═══ is a double bond, and where valency dictates, the trivalency of the nitrogen atom is completed by H, Me, Et or Pr.

25. A method according to claim 24 wherein one or more of the carbon atoms of (I) is substituted by a substituent selected from the group consisting of methyl, ethyl, propyl, oxo, halo, halomethyl, hydroxy, methoxy, ethoxy, propoxy, C$_{1-3}$acyloxy; amino, carboxy, carboxyethyl and carboxymethyl.

26. A method according claim 24 wherein the nitrogenous heterocyclic moieties are selected from the group consisting of thymine, uracil, cytosine, orotic acid and barbituric acid.

27. A method according to claim 23 wherein the photoresponsive moieties are attached to the substrate via a linking group.

28. A method according to claim 27 wherein the linking group is an alkyl chain of from 1 to about 30 carbon atoms, wherein one or more of the carbon atoms can be replaced by, —S—, —O—, —NH— or —C(O)—NH—.

29. A method according to claim 27 wherein the linking group is terminated by a reactive group for attachment to the substrate.

30. A method according to claim 27 wherein the linking group is terminated by a non-reactive group for attachment to the substrate.

31. A method according to claim 23 wherein the substrate is selected from the group consisting of gold, fluorite, alumina, quartz, nickel, silica, mica, zircon, TiO$_2$ and polymeric substrates.

32. A method according to claim 23 wherein the photoresponsive moieties are less than 4 Å apart.

33. A method according to claim 23 wherein the photoresponsive moieties are irradiated with light at a wavelength of about 275 to about 295 nm.

* * * * *